(12) United States Patent
Jow et al.

(10) Patent No.: US 7,102,874 B2
(45) Date of Patent: Sep. 5, 2006

(54) CAPACITIVE APPARATUS AND MANUFACTURING METHOD FOR A BUILT-IN CAPACITOR WITH A NON-SYMMETRICAL ELECTRODE

(75) Inventors: Uei-Ming Jow, Tai Chung (TW); Ying-Jiunn Lai, Ping Tung Hsien (TW); Chun-Kun Wu, Yun Lin Hsien (TW); Pel-Shen Wei, Yungho (TW); Chang-Sheng Chen, Taipei (TW); Ching-Liang Weng, Taipei (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 10/895,116

(22) Filed: Jul. 21, 2004

(65) Prior Publication Data
US 2005/0168913 A1   Aug. 4, 2005

(30) Foreign Application Priority Data
Feb. 2, 2004   (TW) ................. 93102292A

(51) Int. Cl.
  *H01G 4/06* (2006.01)
  *H01G 4/08* (2006.01)
  *H01G 4/30* (2006.01)
(52) U.S. Cl. .............. 361/311; 361/323; 361/301.4; 361/761
(58) Field of Classification Search .......... 361/301.1, 361/301.2, 301.4, 311–315, 320, 321.1, 321.2, 361/321.3, 321.4, 321.5, 323, 761–765
See application file for complete search history.

(56) References Cited

U.S. PATENT DOCUMENTS

| | | | | |
|---|---|---|---|---|
| 4,312,024 A | * | 1/1982 | Pest .................... | 361/271 |
| 5,027,253 A | * | 6/1991 | Lauffer et al. ......... | 361/321.4 |
| 5,079,069 A | | 1/1992 | Howard et al. | |
| 5,745,333 A | * | 4/1998 | Frankeny et al. ....... | 361/313 |
| 6,349,456 B1 | * | 2/2002 | Dunn et al. ............ | 29/25.42 |
| 6,421,225 B1 | * | 7/2002 | Bergstedt ............... | 361/313 |
| 2001/0014004 A1 | * | 8/2001 | Sanville, Jr. ........... | 361/311 |
| 2003/0223177 A1 | * | 12/2003 | Higashi et al. .......... | 361/302 |
| 2004/0108134 A1 | * | 6/2004 | Borland et al. ......... | 174/260 |
| 2004/0120097 A1 | * | 6/2004 | Chambers et al. ....... | 361/301.2 |
| 2004/0124493 A1 | * | 7/2004 | Chua ...................... | 257/508 |
| 2004/0231885 A1 | * | 11/2004 | Borland et al. ......... | 174/260 |
| 2005/0078432 A1 | * | 4/2005 | Gallay et al. ........... | 361/301.3 |

FOREIGN PATENT DOCUMENTS

| | | |
|---|---|---|
| JP | 2001-291637 | 10/2001 |
| TW | 330370 | 4/1998 |
| TW | 511417 | 11/2002 |
| TW | 524381 | 3/2003 |
| TW | 564445 | 12/2003 |

* cited by examiner

*Primary Examiner*—Eric W. Thomas
(74) *Attorney, Agent, or Firm*—Rabin & Berdo, P.C.

(57) ABSTRACT

The present invention describes an intermediate for use in a capacitive printed circuit board (PCB), which relates to a capacitive apparatus and manufacturing method for a built-in capacitor with a non-symmetrical electrode used to reduce inaccuracy of the error compression alignment on laminates. The invention employs a plurality of different sized metal laminates stacked for a built-in capacitor to achieve a high-precise capacitor PCB. More particularly, the invention can raise the capability of noise-immunity of a capacitive PCB applied to high frequency/speed modules and systems, and also provides precise capacitance to regular circuit design for the need of compact package and high-precise capacitance in the future.

7 Claims, 9 Drawing Sheets

CAPACITIVE APPARATUS AND MANUFACTURING METHOD FOR A BUILT-IN CAPACITOR WITH A NON-SYMMETRICAL ELECTRODE

BACKGROUND OF THE INVENTION

1. Field of the Invention

The present invention shows a plurality of different-sized metal laminates stacked for a built-in capacitor in the manufacturing process of a printed circuit board (PCB), which is used to reduce the error in process and raise the capability of noise-immunity in a PCB.

2. Description of Related Art

In the age of high frequency and high-speed electrical systems, the need for accuracy of electrical devices is increasingly acute. The manufacturing process is the focus of efforts to raise the precision of active and passive elements. More particularly, it is a severe challenge to the manufacturing process of capacitor in a PCB, which will be operated at high frequency and is small in size.

In the prior art, there are two main capacitor techniques; one is a discrete component capacitor using surface mount technology (SMT) as an example, the other is a newly developed capacitive substrate. The discrete component capacitor has at least three problems, including: (1) the range of working bandwidth is insufficient; (2) the alternating impedance is not low enough; and (3) the capacitor cannot be integrated into the system in package. Current capacitive substrate elements also have three main drawbacks, including: (1) the via parasite effect is excessive; (2) the electric design thereof is only two-dimensional and the area thereof is too large; and (3) the dielectric material has considerable electric loss. But the PCB with built-in capacitor in the invention can reduce the usage of passive elements for reducing costs, volume, and number of welding points, while raising the reliability and the electric characteristics thereof as well.

The printed circuit board in prior art is usually composed of flat substrates with the same dielectric coefficient; for instance, the Fiberglass Fabric (FR4) is used. However, the noise-immunity of this PCB at high frequencies is bad, and the low passive element integration is a demerit thereof. With further improvement as provided by U.S. Pat. No. 5,079,069 shown in FIG. 1, which is a capacitive laminate for use in a capacitive printed circuit board and method of manufacture, there is a plurality of electronic elements 12 set on a PCB 10. The active elements like ICs, transistors, and the passive elements like capacitors and resistances all can be installed on both sides of PCB 10, which generally is one or a plurality of laminates composed of power, ground or other conductors connected with each other.

In the prior art, the capacitor components are replaced by a built-in capacitive substrate as described in the following.

The role of current PCB is not only to be in charge of the function of, signal transferring as before, but also to integrate many passive or even active elements therein. Reference is made to FIG. 2, which is the cross-sectional view of a PCB fabricated by the built-in method. The surface-mounted device 20 is set on the surface of PCB 10. Power wiring 34 and ground wiring 36 are vertically connected to first plate 28 and second plate 30 of built-in capacitor 26 via conducting openings, respectively, which become the power and ground ends of the capacitor shown as the black spots in the drawing. Accordingly, the built-in capacitor 26 in PCB 10 has a distance between power and ground ends formed by first plate 28 and second plate 30, respectively, and a dielectric material placed between the plates is coupled. A signal wiring 38 passes through the PCB 10 and functions as the wiring of connection or signal transmission among other elements.

FIG. 3 shows a cross-sectional view of a multiple-layer built-in capacitor, which has upper and under side coupled with a built-in capacitor and provides double capacitance in this prior art embodiment.

The advantages of the built-in capacitor in the prior art are described as follows: (1) the interference of high-frequency noise is suppressed; (2) the number of connection layers required in PCB is reduced; (3) the density integrated with the whole system is increased and the area of the PCB is reduced. For raising the capacitive characteristics and restraining noise in the PCB, different dielectric materials are added in the inner layer of substrate in prior art. The main purpose of forming a built-in capacitor using a high dielectric coefficient substrate is to reduce the area of the PCB. Nevertheless, once the area is reduced, inaccuracy increases due to the alignment error in the manufacturing process of the PCB. If the precision of the manufacturing process is insufficient, inaccuracy is easily produced by compression alignment errors, and a difference between the two plates in the manufacturing process will not provide high-precision discrete capacitor.

In the top view of built-in capacitor shown in FIG. 4A, there are two parallel plates 28', 30' of a capacitor, which are like first plate 28 and second plate 30 shown in FIG. 2. The precision of manufacturing process is not high enough and results in an opposite slip between the two plates shown in drawing. Thus, only the shaded part area contributes to the capacitor, which is not the intended result. FIG. 4B is cross-sectional view of the two plates, which also shows the opposite slip therebetween.

The present invention thus employs different sized plates formed with non-symmetrical electrodes as the capacitive apparatus of built-in capacitor, where the bigger one will cover the smaller one to reduce the error compression alignment and improve the noise-immunity and efficiency of a capacitive substrate with a high precision capacitor.

SUMMARY OF THE DISCLOSURE

Broadly speaking, the present invention discloses a capacitive apparatus and manufacturing method for a built-in capacitor with non-symmetrical electrode, which employs a plurality of different sized metal laminates stacked built-in capacitor in the manufacturing process of a PCB and reduces the error in process of compression alignment for raising the capability of noise-immunity in a PCB and promoting integral capacitance.

The present invention relates to the non-symmetrical electrodes used in a PCB for increasing capacitance and promoting the precision in the manufacturing process thereof. The capacitive apparatus comprises a first plate and a second plate separated from the first plate by a distance. The size of the second plate is different from that of the first plate, and the bigger one covers the smaller one. A dielectric is located between the first and second plate.

BRIEF DESCRIPTION OF DRAWINGS

The present invention will be readily understood by the following detailed description in conjunction with the accompanying drawings, in which.

DETAILED DESCRIPTION OF THE PREFERRED EMBODIMENTS

The capacitor for noise-filtering or voltage-stabilizing in a printed circuit board (PCB) is required to work at high frequency and be small in size, such that a capacitive substrate must be built in the PCB. The present invention discloses a capacitive apparatus and manufacturing method for a built-in capacitor with a non-symmetrical electrode to reduce the effect of misalignment of substrates built in the PCB. In other words, to improve the precision of the capacitive substrate, the invention adopts a plurality of metal laminates with a non-symmetrical area to compensate for misalignment, and as a substitute for the capacitor with an equal-area electrode.

Figure 1:
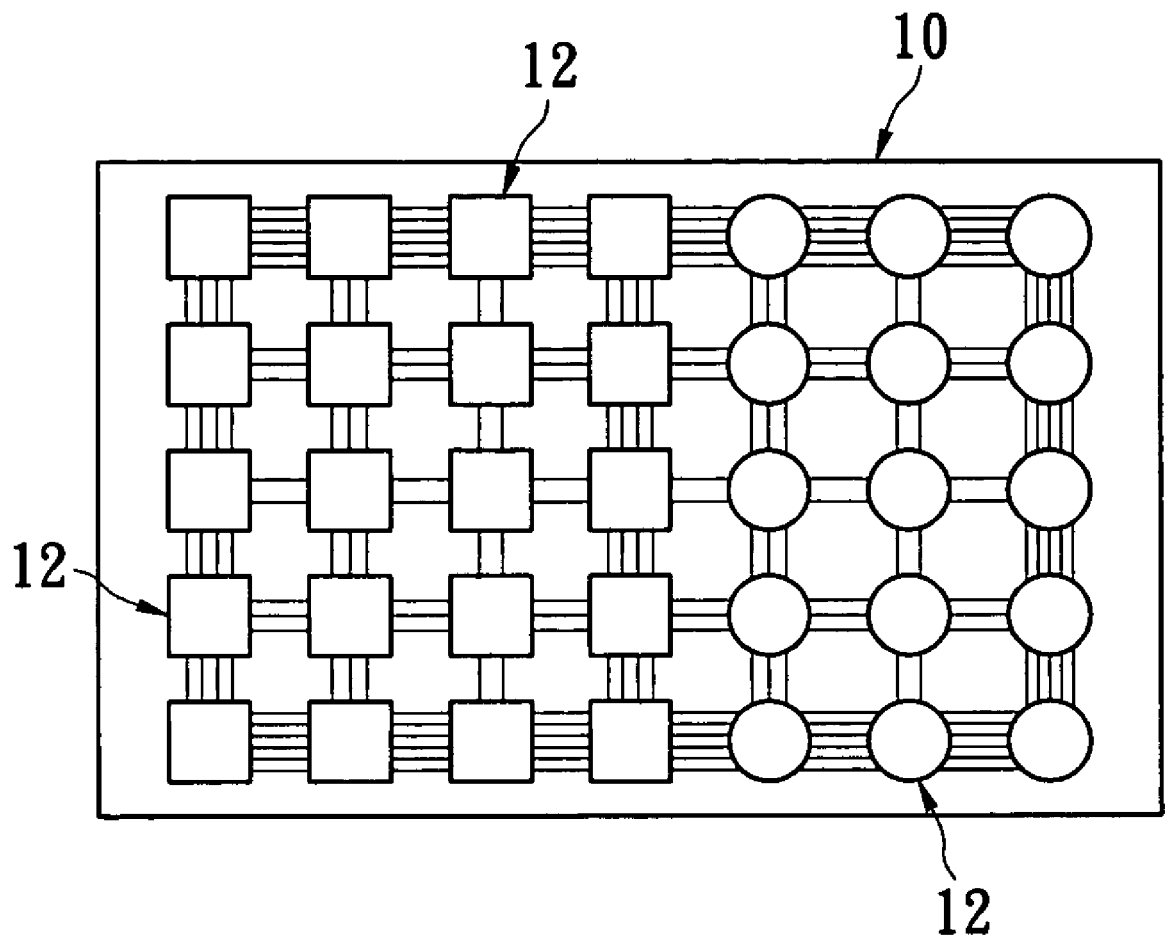
FIG. 1 is a schematic drawing of a printed circuit board of the prior art.
Figure 2:
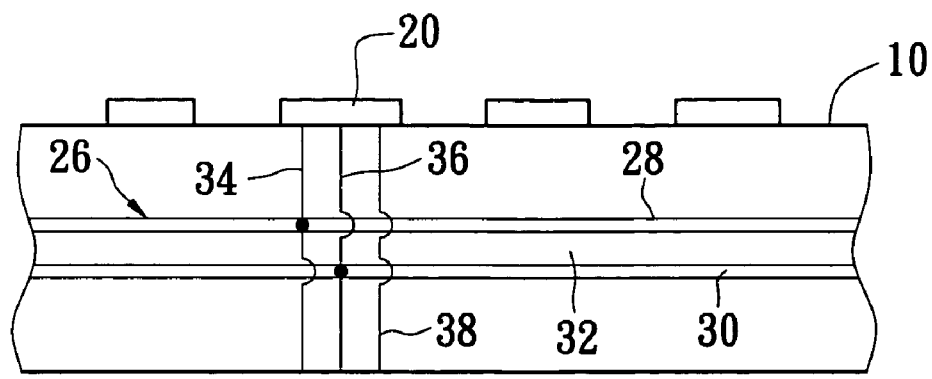
FIG. 2 is a schematic drawing of a cross-sectional view of a PCB in the prior art.
Figure 3:
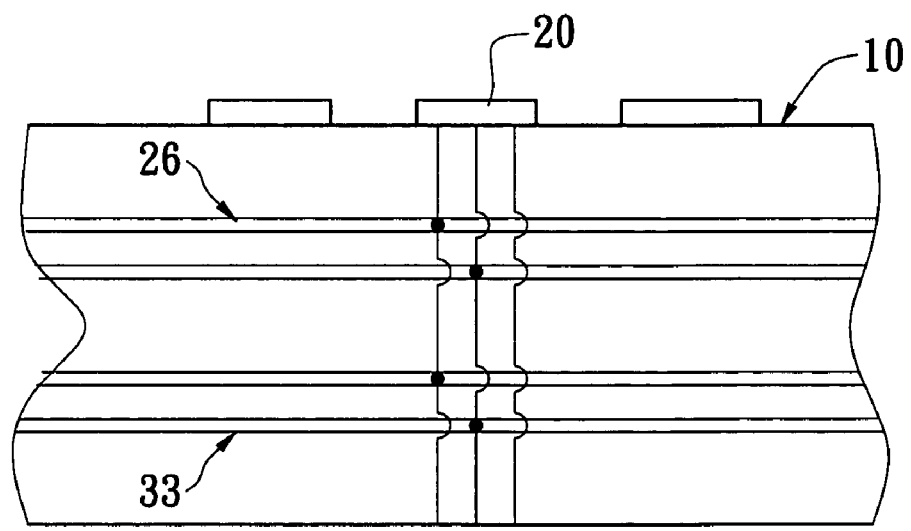
FIG. 3 is a schematic drawing of a cross-sectional view of a multi-layer built-in capacitor in the prior art.
Figure 4A:
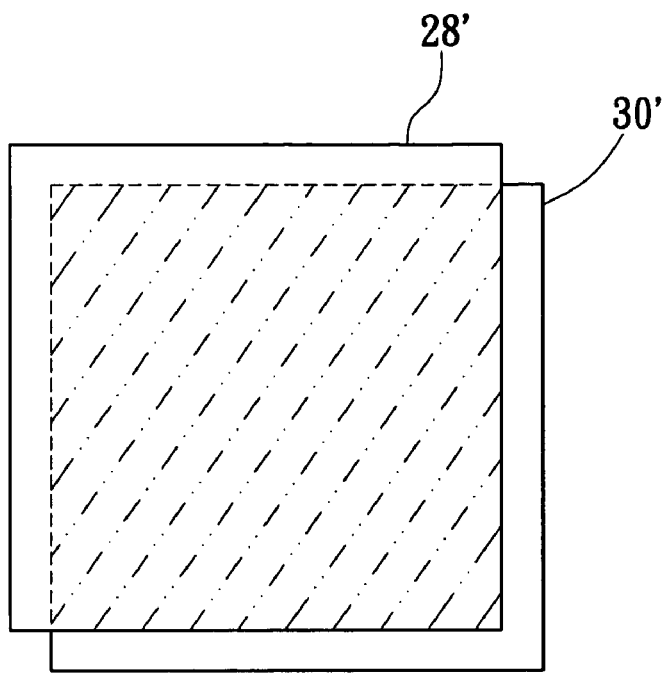
FIG. 4A is a schematic drawing of a top view of a built-in capacitor in the prior art.
Figure 4B:
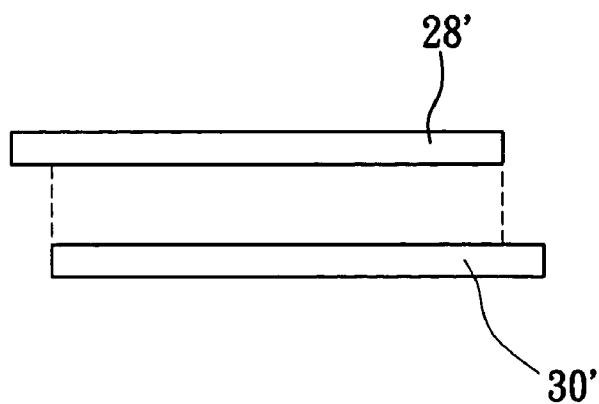
FIG. 4B is a schematic drawing of a cross-sectional view of a built-in capacitor in the prior art.
Figure 5A:
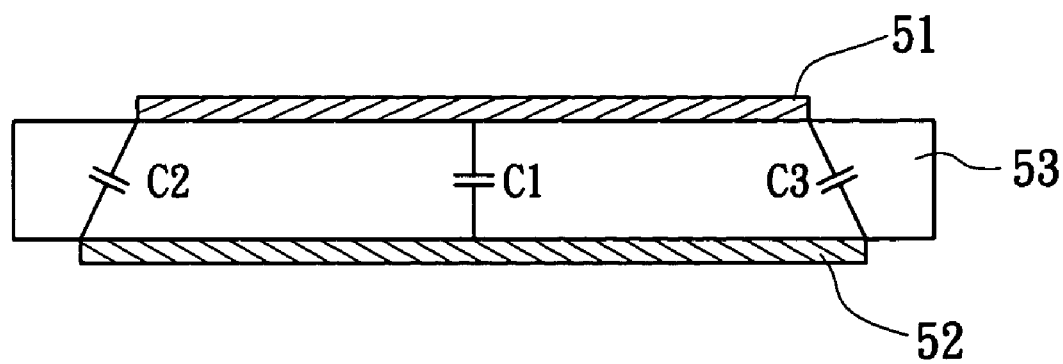
FIG. 5A is a schematic drawing of a side view of built-in capacitor in the present invention.

Reference is made to FIG. 5A, which shows a cross-sectional view of the embodiment of a built-in capacitor with a non-symmetrical electrode. The area of a first plate 51 is different from that of a second plate 52, and the bigger one covers the smaller one. The example in FIG. 5A shows that the second plate 52 is bigger than the first plate 51, and an equivalent capacitor is formed by the coupling effect between the first plate 51 and the second plate 52, and has higher capacitance by using dielectric 53 with a high dielectric coefficient in that limited area. Besides the central main couples to a first equivalent capacitor C1, some coupling effect still occurs on the edge since the area of upper and under electrodes are not precisely the same and the alignment is not perfectly parallel. Even though the size of plates are precisely the same and the alignment is perfectly parallel, there still has the equivalent capacitor existed on the edge. Like a second equivalent capacitor C2 and a third equivalent capacitor C3 shown in FIG. 5A, a capacitor is composed of different sized plates. The second plate 52 covers the whole first plate 51, and the coupling area is supposed to reach the expected area, i.e. the smaller plate's area, even when an opposite slip still occurs between these plates and the equivalent capacitors still happen on the edge. For reaching the coupling area (C1) with determined capacitance, the present invention discloses a capacitive apparatus to get an expected area by enlarging one of the plates.

Figure 5B:
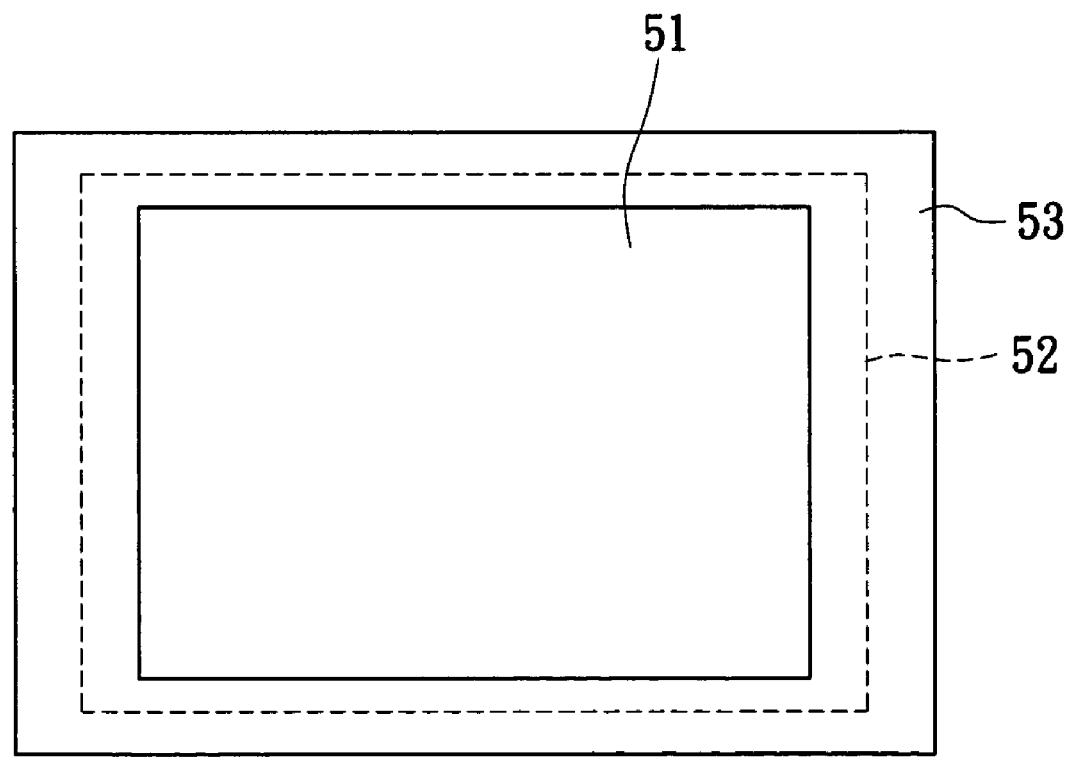
FIG. 5B is a schematic drawing of a top view of built-in capacitor in the present invention.

FIG. 5B is a top view of the embodiment of the invention which manifests the area of first plate 51 as the area of equivalent capacitor.

Figure 6:
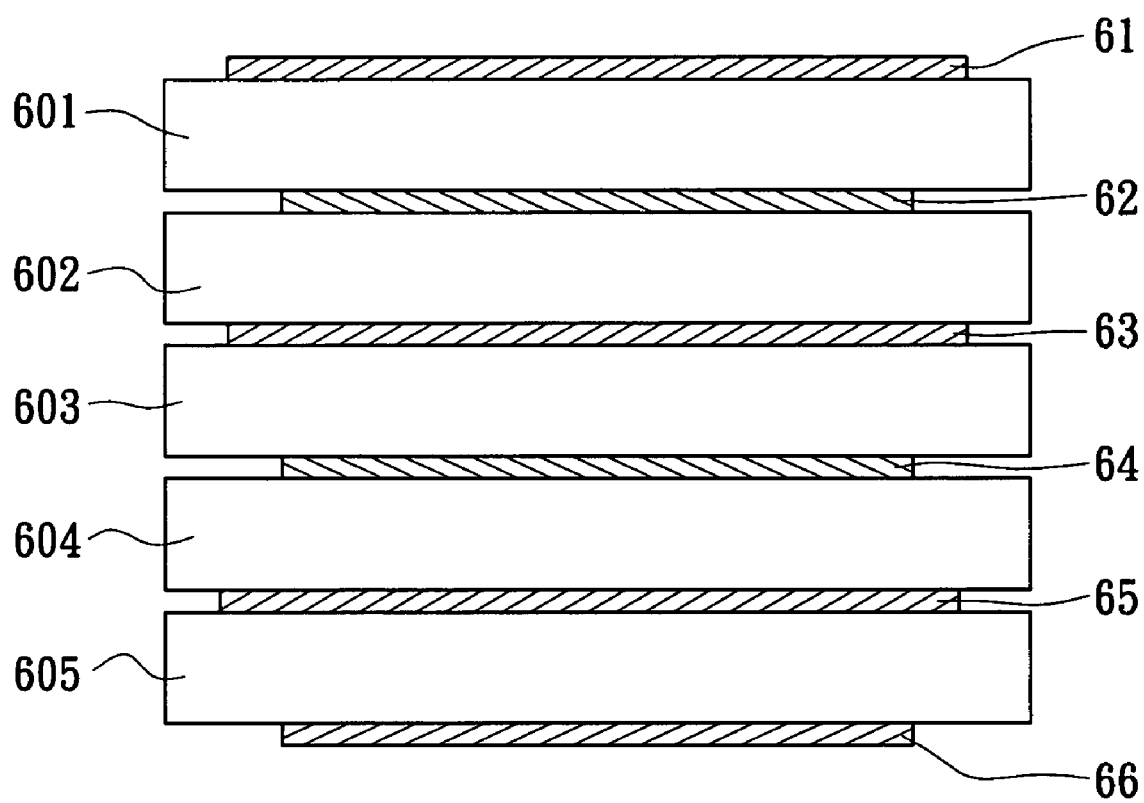
FIG. 6 is a schematic drawing of a cross-sectional view of a multi-layer capacitive substrate in the present invention.

FIG. 6 is a cross-sectional view of a multi-layer capacitive substrate in the invention. A multi-layer capacitive device is composed of a plurality of plates (61, 62, 63, 64, 65, 66) in a PCB. For achieving the expected capacitance, the different sized plates are stacked up one by one, and the bigger one covers the smaller one. For increasing the capacitance to the expected value, the dielectric (601, 602, 603, 604) can be filled among the plates further.

Figure 7A:
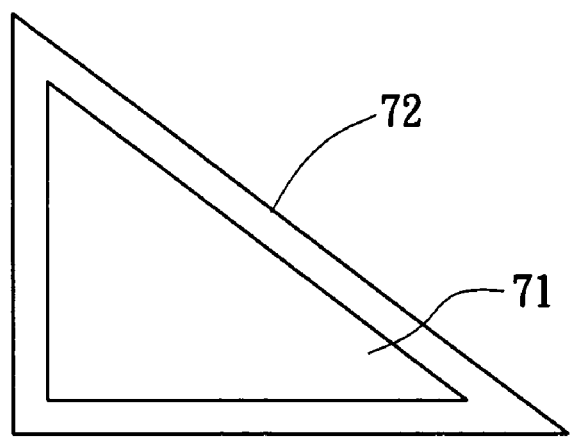
FIG. 7A is a schematic drawing of a first embodiment in the present invention.

The shape of the plates is not limited to a rectangle as described above. A built-in capacitor with triangular form (71,72) as shown in FIG. 7A is possible, where the second triangular plate 72 is bigger and covers the first triangular plate 71. Round plates as in the second embodiment shown in FIG. 7B, with first round plate 73 and second round plate 74, are also possible. Nevertheless, the plates shown in the description of the present invention are not limited to those described above.

Figure 7B:
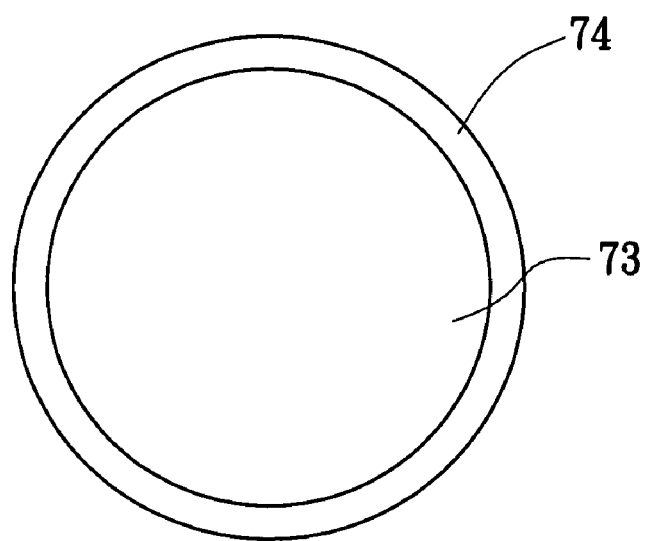
FIG. 7B is a schematic drawing of a second embodiment in the present invention.

FIGS. 5B, 7A, and 7B show the first plate and the second plate are geometrically similar, i.e., they have a same shape even though of different sizes.

Figure 8:
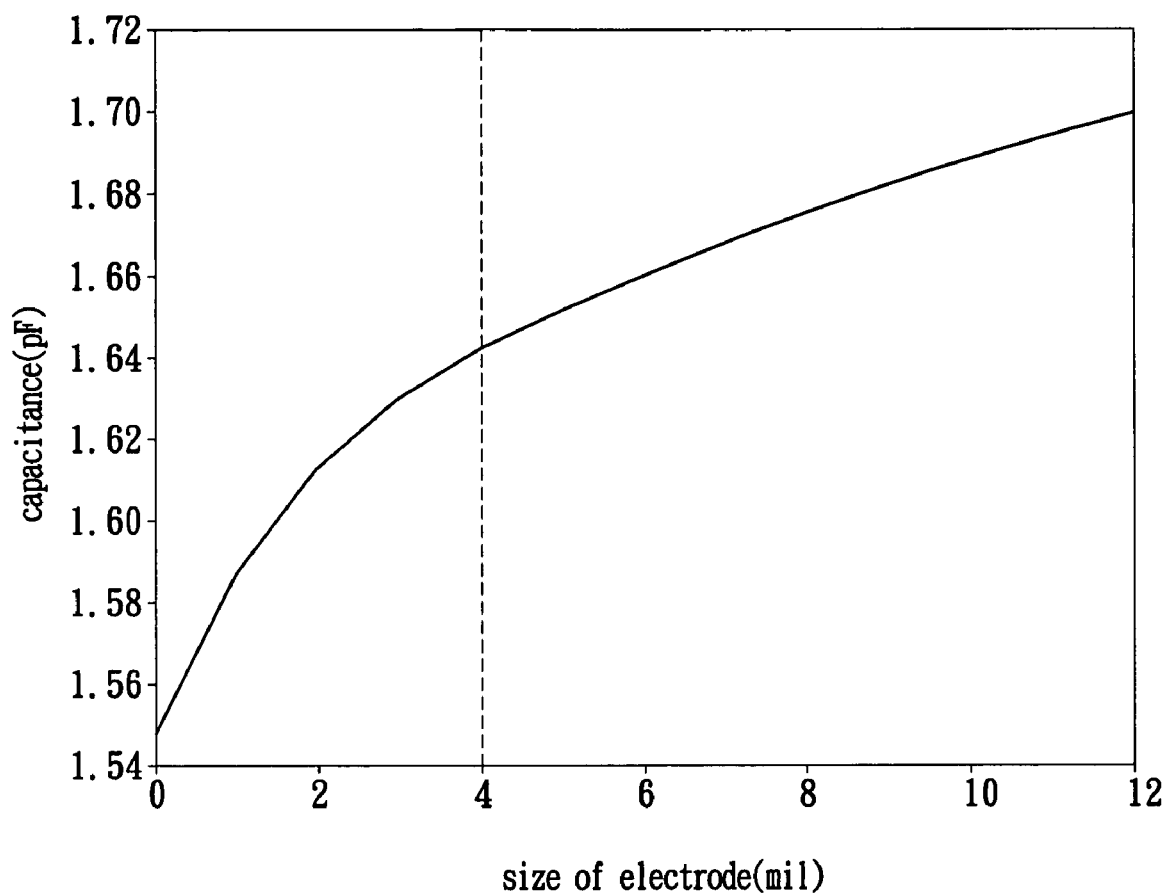
FIG. 8 is a relationship diagram of electrode size and the equivalent capacitance in the present invention.

When the size of plates is continuously enlarged, as the second equivalent capacitor C2 and third equivalent capacitor C3 shown in FIG. 5A, in which one of the plate's area will not change, the equivalent capacitance will increase contiguously due to the coupling effect on the edge. FIG. 8 shows a simulation result made from high-frequency simulation software (HFSS) employing 20*20 mil$^2$ built-in capacitor by Ansoft corporation and the result proves that the capacitance will increase constantly by further enlarging the bigger plate; that is, the capacitive apparatus for a built-in capacitor with a non-symmetrical electrode disclosed in the present invention is helpful to increase the equivalent capacitance. From the data shown before the dotted line in FIG. 8, the capacitance increases effectively by further enlarging the plate. However, as the area of plate shown in diagram goes beyond the dotted line, the capacitance increases linearly, but is not actually necessary in current invention.

Figure 9A:
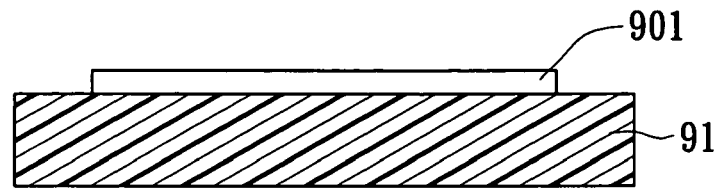
FIG. 9A to FIG. 9D are a flow chart of a method for the manufacturing process in the present invention.
Figure 9B:
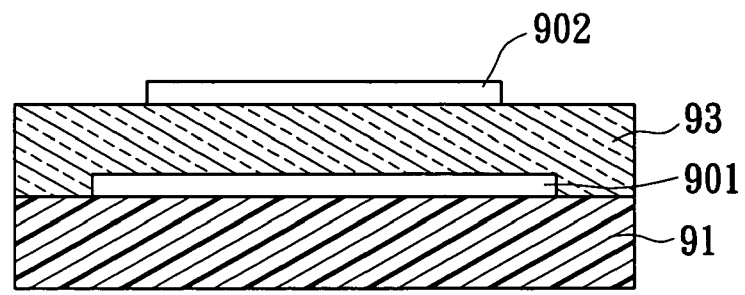
Figure 9C:
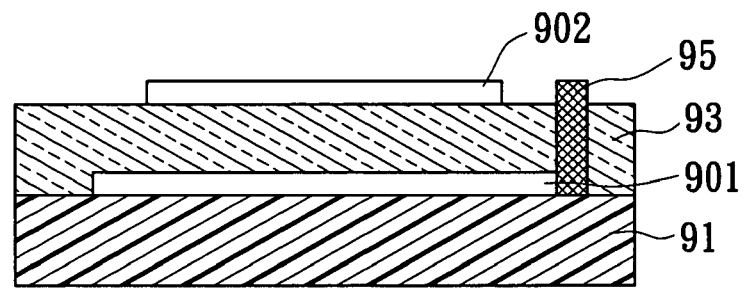
Figure 9D:
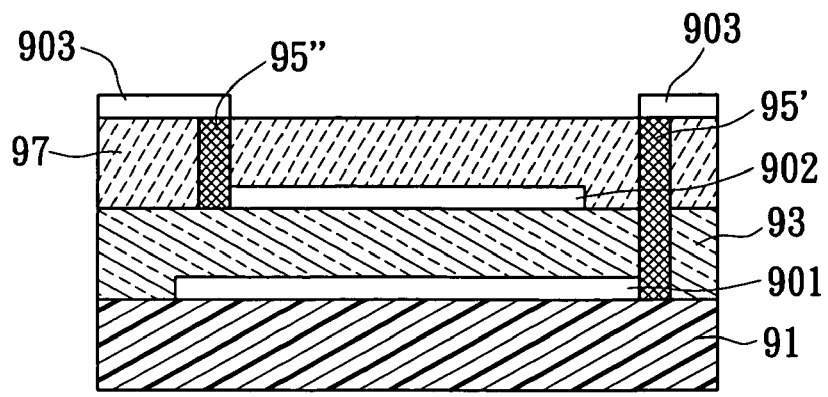

Reference is made to FIG. 9A to FIG. 9C, which show the steps of the manufacturing method in the present invention. FIG. 9D shows a structure of a two-port built-in capacitor with a non-symmetrical electrode. The manufacturing method of the present invention can be implemented in multiple ports, and the following description is an example of a double-port structure. Generally, in the application of a manufacturing method for multi-layer PCB, the vias should be designed in advance so as to define the polarity (power/ground) in inner layers of PCB. The frequency requirement of a capacitor is getting higher for noise-filtering and voltage-stabilizing in a PCB; therefore, for suppressing the interference of high-frequency noise and reducing the number of wiring layer in PCB, the present invention provides the following steps to provide a high dielectric coefficient and increase the capacitance of a built-in capacitor:

As shown in FIG. 9A, a double-layer copper-tinsel substrate 91 is used as an insulator and the support for the whole substrate. A metal conducting layer is then deposited or electroplated on the substrate 91 to form a first plate 901 of built-in capacitor and etching the metal conducting layer to the required size. FIG. 9B is shown as compressing an appropriate dielectric 93 on the first plate 901 formed by the substrate and the metal conducting layer, and depositing and etching another metal conducting layer on the dielectric 93 to form a second plate 902, or some other relative circuit.

For resolving the error from alignment in manufacturing process, the first plate 901 and second plate 902 are formed as non-symmetrical and different in size in the present invention and the first plate 901 is bigger and overlaps the second plate 902 in this embodiment.

FIG. 9C shows the step of drilling one or a plurality of vias 95 in the form of blind holes on dielectric 93 by laser boring, and the first plate 901 connects the outer devices via these vias 95, which are junction points between built-in capacitor and transmission lines. Then the surface-mounted devices connect with these vias by electroplating metal conducting material thereon. The description above shows the steps of the manufacturing method for a built-in capacitor with a non-symmetrical electrode in the present invention, and, by repetition, the method to form a multi-layer built-in capacitor with a non-symmetric electrode, and the plates therebetween are not symmetrical with each other.

FIG. 9D further includes the manufacturing step of outer layer 97 inserted above the dielectric 93 and the second plate 902 in the capacitive apparatus of the present invention. The outer layer 97 inserted is the other dielectric material for forming the outer circuit and outer devices 903.

Like the steps disclosed in FIG. 9A to FIG. 9C, and referring to FIG. 9D, after the steps of drilling one or a plurality of vias (95') in the first plate 901 and drilling one or a plurality of vias (95") in the second plate 902. The outer devices 903 connect with the first plate 901, i.e. the first electrode of the capacitive apparatus, by electroplating metal conducting material into first via 95', and connect with the second plate 902, i.e. the second electrode, by electroplating metal conducting material into second via 95". These vias 95', 95" are the metal conductor which form the wiring and further determine the electrodes of the capacitive apparatus. A multi-layer built-in capacitor with a non-symmetric electrode is thereby formed by repetition of the above-described process.

Figure 10:
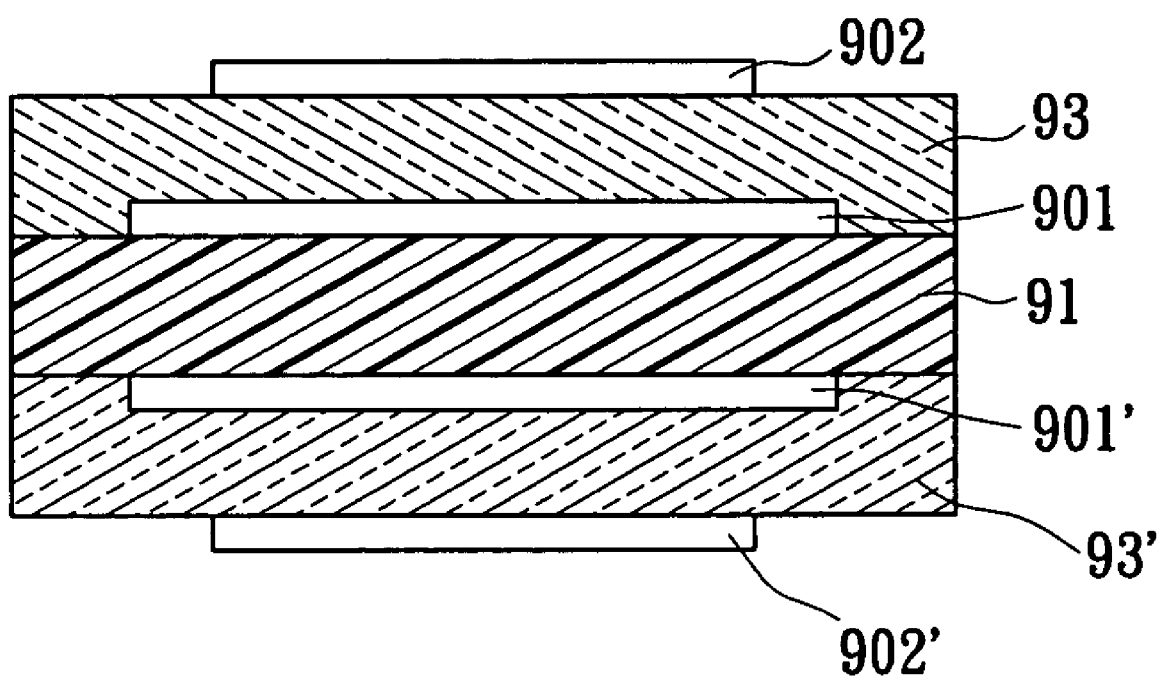
FIG. 10 is a schematic drawing of a multi-layer non-symmetrical electrode in the present invention.

Reference is made to FIG. 10, which is schematic drawing of multi-layer non-symmetrical electrode in the present invention, and is alternative embodiment of the method mentioned above. Like the structure shown in FIG. 9C, the FIG. 10 shows a structure of multi-layer built-in capacitor with non-symmetrical electrode by forming a built-in capacitor at another side of the substrate 91, more dielectric is compressed and inserted into the capacitive apparatus by means of forming the devices including first plates 901, 901', dielectric 93, 93' and second plates 902, 902' on both sides of substrate 91 as shown in FIG. 10.

The present invention relates to a capacitive apparatus and manufacturing method for a built-in capacitor with a non-symmetrical electrode used to raise the capability of noise-immunity of a capacitive PCB applied to high frequency/speed modules and systems, and also provides least-error capacitance to regular circuit design requiring compact package and high-precision capacitance in the future.

The many features and advantages of the present invention are apparent from written description above and those it is intended by appended claims to cover all. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A capacitive apparatus for a built-in capacitor with at least one pair of electrodes having sizes that are non-symmetrical, wherein the non-symmetric electrodes are employed in a PCB to minimize the capacitance inaccuracy due to PCB alignment deviation in a lamination process thereof, said capacitive apparatus comprising:
    a plurality of said first plates are interposed with a plurality of said second plates;
    wherein each first plate is separated from each second plate by a distance containing a dielectric, wherein said first plate and said second plate are different in size, said first plate is smaller than said second plate, and said second plate covers said first plate; and
    said dielectric being located between said first plate and said second plate;
    wherein both of said first plate and said second plate comprise conductive patterns;
    wherein said first plate and said second plate have a one-to-one relation and form a two-port capacitor, wherein said first plate connects to other components through wiring and/or vias as one port of the two-port capacitor, and said second plate connects to the other components through the wiring and/or vias as another port of the two-port capacitor; and
    wherein said plurality of said first plates interposed with said plurality of said second plates form a multi-layer built-in capacitor with non-symmetric electrodes, wherein each said first plates is one-to-one interposed with each said second plates.

2. The capacitive apparatus as recited in claim 1, wherein that each said first plate is one-to-one interposed with each said second plate comprises that there is only one smaller plate between bigger plates and there is only one bigger plate between smaller plates.

3. The capacitive apparatus as recited in claim 1, wherein the one-to-one relation comprises that the second plate corresponds to one respective first plate, and the first plate corresponds to exactly one respective second plate.

4. The capacitive apparatus as recited in claim 1, wherein the first plate and the second plate are geometrically similar.

5. The capacitive apparatus as recited in claim 4, wherein said first plate and said second are non-rectangular.

6. The capacitive apparatus as recited in claim 1, wherein the conductive patterns are conductive patterns comprised of the PCB.

7. The capacitive apparatus as recited in claim 1, wherein said distance is substantially constant throughout said multi-layer built-in capacitor.

* * * * *